(12) United States Patent
Kwan et al.

(10) Patent No.: US 6,798,297 B1
(45) Date of Patent: Sep. 28, 2004

(54) METHOD AND APPARATUS FOR CONVERGING A CONTROL LOOP

(75) Inventors: King H. Kwan, Bellevue, WA (US); Galen E. Stansell, Kirkland, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 29 days.

(21) Appl. No.: 10/301,768

(22) Filed: Nov. 20, 2002

(51) Int. Cl.[7] .............................................. H03L 7/08
(52) U.S. Cl. ........................ 331/10; 331/17; 331/25; 327/156
(58) Field of Search ...................... 331/1 A, 10, 17–18, 331/25; 327/156–159; 332/127; 360/51; 375/376; 455/260

(56) References Cited

U.S. PATENT DOCUMENTS 5,168,245 A * 12/1992 Koskowich ................. 331/1 A

* cited by examiner

Primary Examiner—David Mis
(74) Attorney, Agent, or Firm—Okamoto & Benedicto LLP

(57) ABSTRACT

In one embodiment, a control loop in an electrical circuit includes a variable feed-forward circuit configured to determine a setting of a variable oscillator that would result in a frequency of a first signal approximating a frequency of a second signal. The setting may be used to control the variable oscillator at a time when a phase error between the first signal and the second signal is negligibly small (e.g., substantially zero), thus allowing for relatively short loop convergence time.

19 Claims, 7 Drawing Sheets

METHOD AND APPARATUS FOR CONVERGING A CONTROL LOOP

BACKGROUND OF THE INVENTION

1. Field of the Invention

The present invention relates generally to electrical circuits, and more particularly, but not exclusively, to control loops.

2. Description of the Background Art

Electrical circuits with control loops are well known in the art. In digital clock circuits, for example, a digital control loop may be employed to synchronize an output clock with an incoming reference signal. Such digital clock circuits may be used for clock recovery, clock generation, and other timing-related applications.

A conventional digital control loop 100 is schematically illustrated in FIG. 1. In control loop 100, RefIn 110 is an input reference signal to a digital phase detector 101. Phase detector 101 also receives FBIn 112, which is a feedback signal presented by a digitally controlled oscillator (DCO) 105. FBIn 112 or another output signal of DCO 105 may be used to provide timing information to other circuits not specifically shown. For example, FBIn 112 may be used as a synchronizing clock.

Phase detector 101 presents a phase error signal, referred to as "RefLead 114", based on a phase difference between RefIn 110 and FBIn 112. RefLead 114 may be a 1-bit digital signal that is in a logical HIGH state when RefIn 110 is leading FBIn 112 in phase, and in a logical LOW state when RefIn 110 is lagging FBIn 112 in phase. A loop filter comprising a pre-count divider 102 and an up/down counter 103 helps stabilize the loop. Pre-count divider 102 receives RefLead 114 and, depending on the number of RefLeads 114 going in a particular direction it has received, presents an up signal or a down signal to up/down counter 103. Up/down counter 103 increments its count upon receipt of an up signal, and decrements its count upon receipt of a down signal.

Still referring to FIG. 1, an adder 104 adds RefLead 114 to the output of the count of up/down counter 103. The resulting sum from adder 104, referred to as "DCOIn 116", is presented as a control signal to DCO 105. DCO 105 adjusts the frequency of FBIn 112 according to DCOIn 116. The process of receiving RefIn 110, determining if RefIn 110 is leading or lagging FBIn 112, and accordingly controlling DCO 105 to adjust the frequency of FBIn 112 is repeated for several cycles until FBIn 112 and RefIn 110 have the same phase and frequency.

Like most digital phase detectors, phase detector 101 is of the so-called "bang-bang" type. Specifically, unlike its analog counterpart, phase detector 101 can only tell if RefIn 110 is leading or lagging FBIn 112—phase detector 101 cannot tell the amount of phase mismatch between the two signals. Thus, in control loop 100, the amount of phase mismatch between a reference signal and a feedback signal is ignored in converging the loop. Instead, the frequency of the feedback signal is continually adjusted until the feedback signal and the reference signal are in phase and have the same frequency. One problem with this approach is that it may take a lot of cycles before the loop converges.

SUMMARY

In one embodiment, a control loop in an electrical circuit includes a variable feed-forward circuit configured to determine a setting of a variable oscillator that would result in a frequency of a first signal approximating a frequency of a second signal. The setting may be used to control the variable oscillator at a time when a phase error between the first signal and the second signal is negligibly small (e.g., substantially zero), thus allowing for relatively short loop convergence time.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
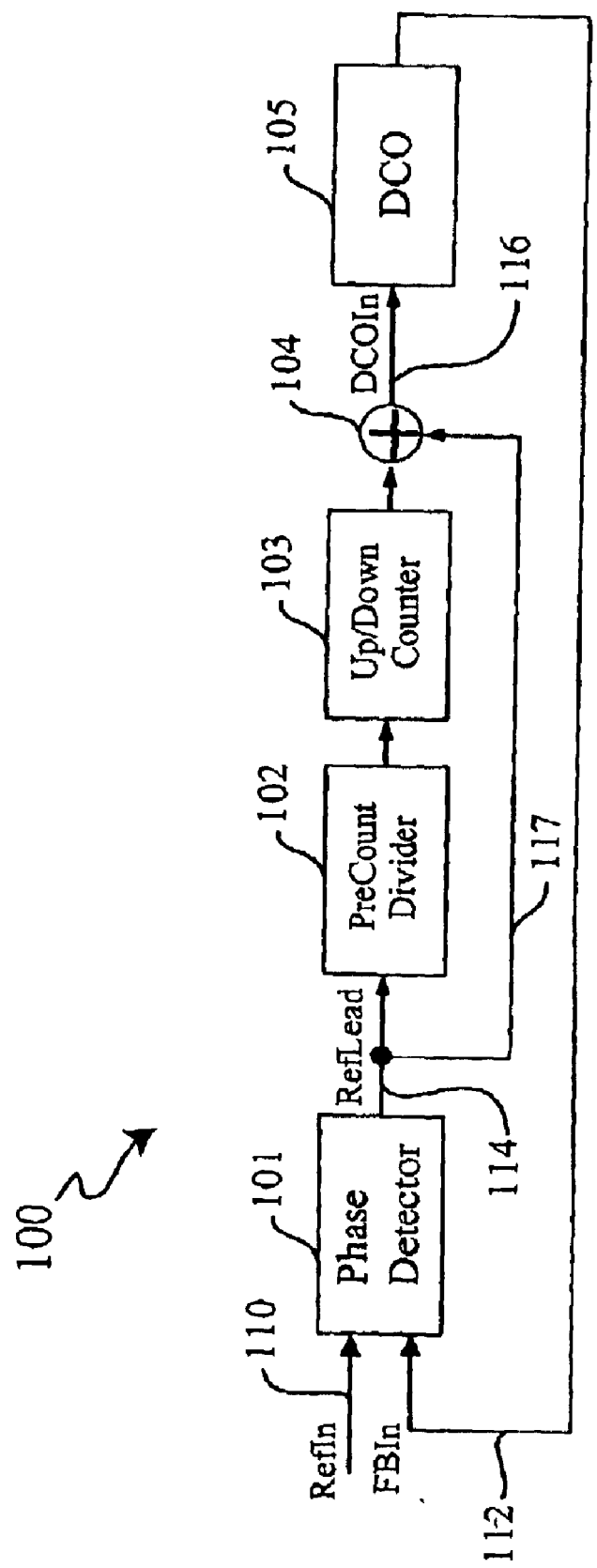
FIG. 1 schematically illustrates a conventional digital control loop.

Referring back to FIG. 1, control loop 100 employs what is referred to as a "fixed-value feed-forward mechanism", which comprises adder 104 and forward path 117. The feed-forward mechanism adds the phase error signal from phase detector 101 to the count signal from up/down counter 103 to control DCO 105, and thereby improve system response to phase changes. Specifically, RefLead 114 is added to the input to DCO 105 to improve the response of control loop 100 to phase changes between RefIn 110 and FBIn 112. RefLead 114 is a "fixed value" because it does not have any information as to the amount of phase mismatch between RefIn 110 and FBIn 112. In other words, RefLead 114 always adds a "1" to the loop when RefIn 110 is leading, and a "0" when RefIn 110 is lagging.

Although a fixed-value feed-forward mechanism may be suitable for some applications, such a mechanism may not be adequate in applications calling for relatively fast loop convergence time. This problem with fixed-value feed-forward mechanisms is further explained with reference to FIGS. 2 and 3.

Figure 2:
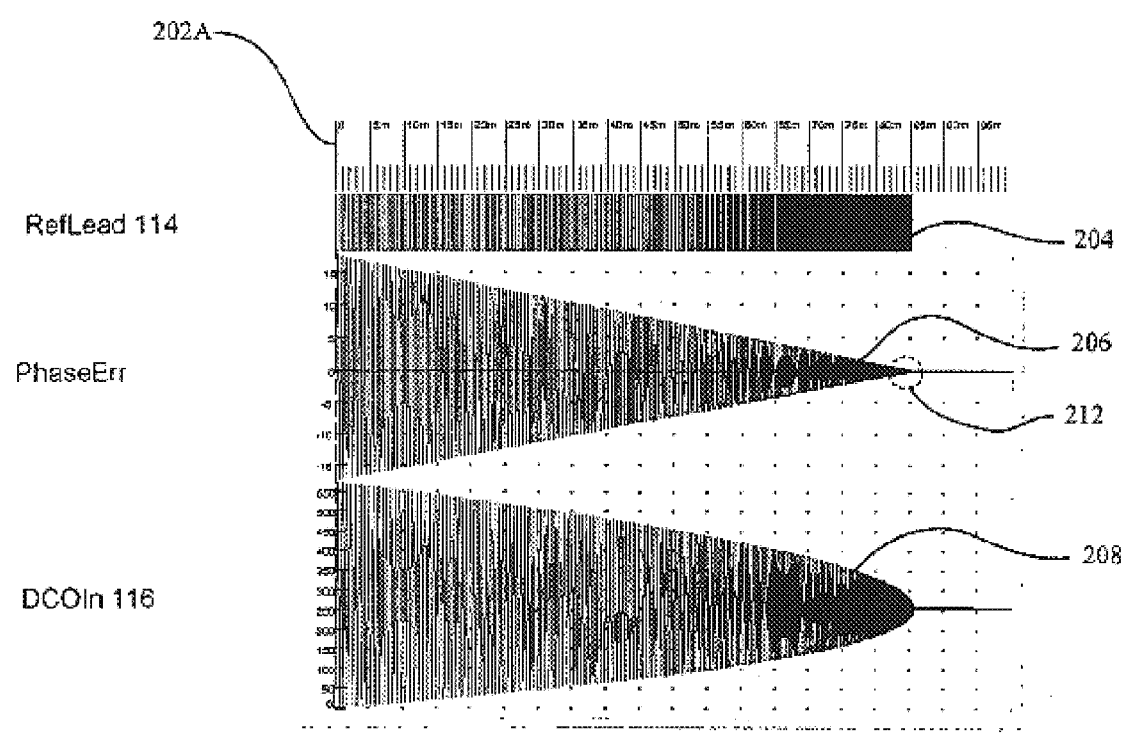
FIG. 2 shows a behavioral simulation of the control loop of FIG. 1.

FIG. 2 shows a behavioral simulation performed by the inventors on control loop 100. In FIG. 2, horizontal axis 202A represents time in milliseconds. Plot 204 corresponds to the output of phase detector 101 which is RefLead 114. Plot 206 is the phase error between RefIn 110 and FBIn 112. Plot 208 corresponds to the value of the digital control signal to DCO 105, which is DCOIn 116.

For the simulation of FIG. 2, DCO 105 is set to be a digitally controlled crystal oscillator comprising a conventional Pierce oscillator with a 13.5 MHz pullable (i.e., adjustable) crystal. DCOIn 116 is set to be a 10-bit digital signal adjusting the input capacitance of the Pierce oscillator, which in turn adjusts the frequency of FBIn 112. Pre-count divider 102 is set to a value of seven to adjust the loop update rate. The simulation was performed using the VERILOG-XL simulation software available from Cadence Design Systems of San Jose, Calif. As pointed by dashed circle 212, control loop 100 took approximately 85 milliseconds to converge.

Figure 3:
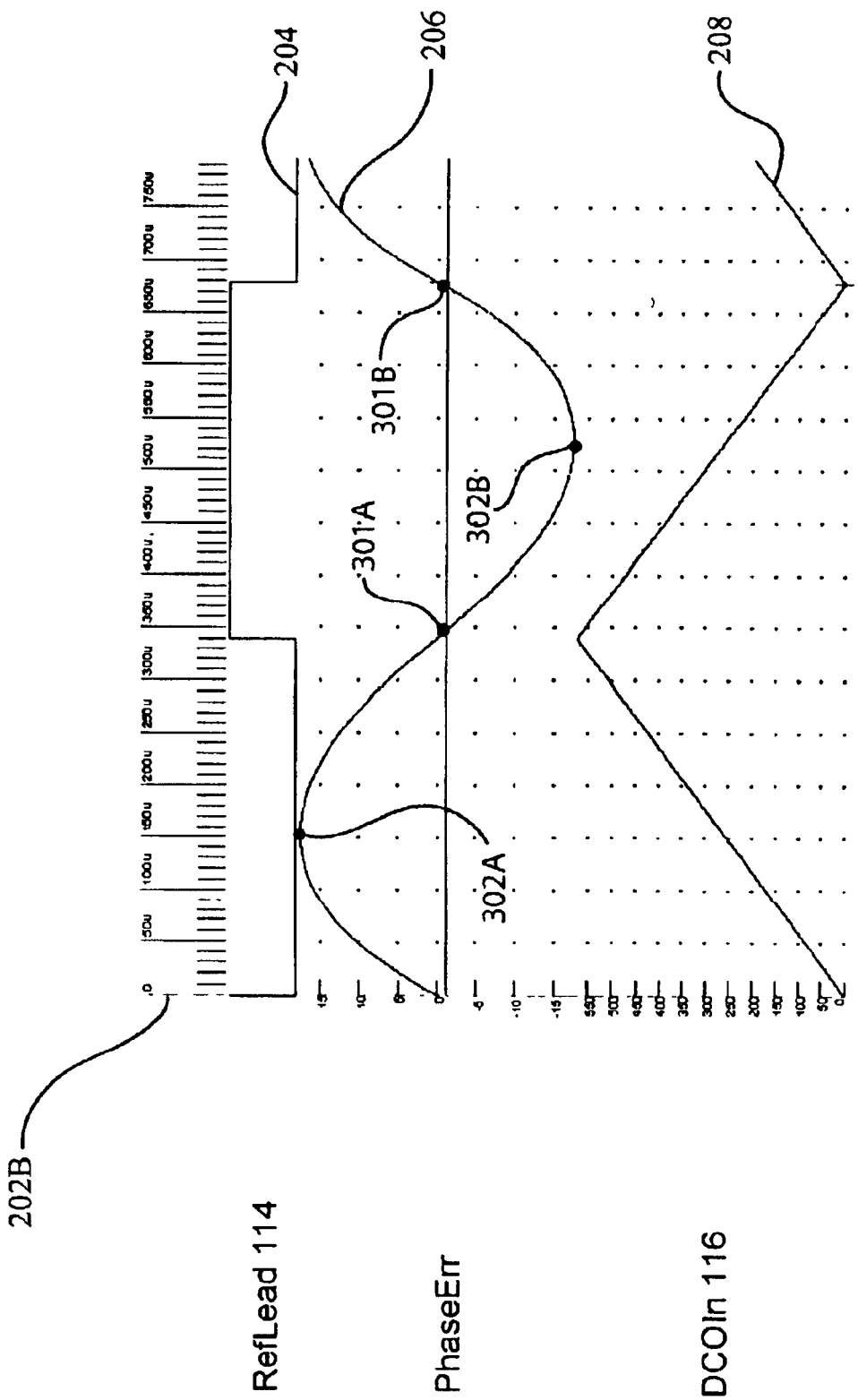
FIG. 3 is a zoom-in view showing the first few milliseconds of the simulation of FIG. 2.

FIG. 3 is a zoom-in view showing the first few milliseconds of the simulation of FIG. 2. In FIG. 3, horizontal axis 202B represents time in microseconds. At time t=0, the phase error is zero indicating that FBIn 112 is in-phase with RefIn 110. However, at t=0, the frequency of FBIn 112 is not the same as that of RefIn 110. Phase error accumulates as the loop adjusts the frequency of FBIn 112 to match that of RefIn 110. Phase error reaches its peak value at point 302A where the change in phase error with respect to a change in time is zero. In other words, assigning ϕ to mean phase error, phase error is at a maximum at points on plot 206 where dΦ/dt=0. Examples of points where phase error is at a maximum are points 302A and 302B. At point 302A (and point 302B), FBIn 112 and RefIn 110 have reached a common frequency. However, at point 302A, FBIn 112 and RefIn 110 are not in-phase. As the frequency of FBIn 112 is adjusted to match that of RefIn 110, phase error reaches zero at point 301A (and later on at point 301B). At point 301A, FBIn 112 is again in-phase with RefIn 110, but the two signals do not have the same frequency. Control loop 100 compensates by controlling DCO 105 to adjust the frequency of FBIn 112, which leads to negative phase error. These correction cycles repeat until FBIn 112 and RefIn 110 are in-phase and the have the same frequency. But because the correction in each cycle is relatively small, it may take a long time before the loop converges.

Figure 4:
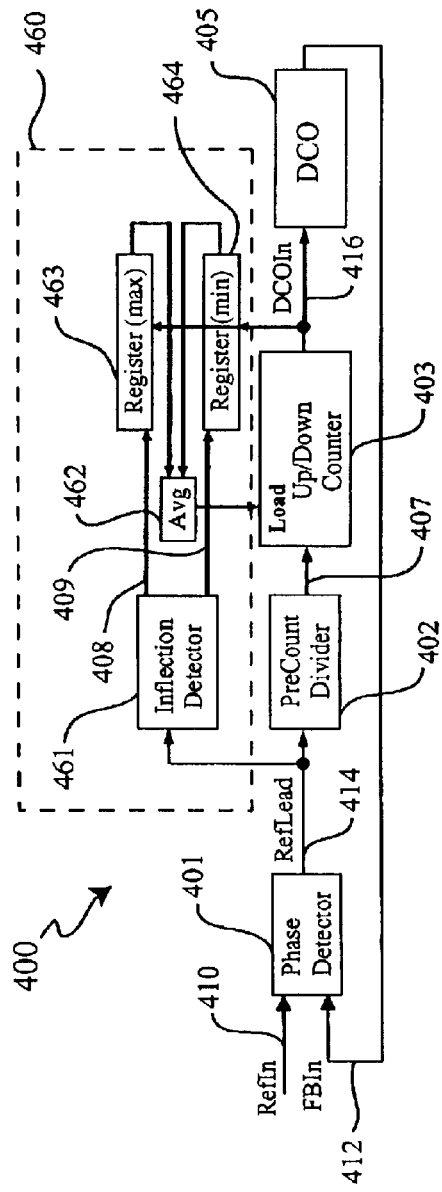
FIG. 4 shows a digital control loop in accordance with an embodiment of the present invention.

Embodiments of the present invention are now discussed beginning with FIG. 4. FIG. 4 shows a digital control loop 400 in accordance with an embodiment of the present invention. Control loop 400 may be employed in a variety of applications. For example, control loop 400 may be employed to align phases between two systems, to re-produce signals running at a frequency multiple of an input frequency, and other timing-related applications.

Control loop 400 includes a digital phase detector 401, which accepts an input reference signal RefIn 410 and a feedback signal FBIn 412. Phase detector 401 presents a phase error signal RefLead 414. RefLead 414 may be a 1-bit digital signal indicative of a phase error between RefIn 410 and FBIn 412. In one embodiment, RefLead 414 is at a logical HIGH state when RefIn 410 leads FBIn 412, and at a logical LOW state when RefIn 410 lags FBIn 412. Phase detector 401 may be of a bang-bang type, for example.

A pre-count divider 402 receives RefLead 414 and presents an output signal 407 to a counter 403. Output signal 407 may be a 1-bit digital signal providing direction information to counter 403. For example, pre-count divider 402 may present output signal 407 as a logical HIGH signal to increment the count of counter 403, and as a logical LOW signal to decrement the count of counter 403. Pre-count divider 402 may be configured to look for a minimum total number of RefLeads 414 going in a particular direction before presenting output signal 407. For example, pre-count divider 402 may be configured to look for a certain number of cycles where RefLead 414 is a logical HIGH before presenting output signal 407 as a logical HIGH. Similarly, pre-count divider 402 may be configured to look for a certain number of cycles where RefLead 414 is a logical LOW before presenting output signal 407 as a logical LOW. As can be appreciated this allows pre-count divider 402 to adjust the update rate of the loop.

In one embodiment, counter 403 is an up/down counter with asynchronous load capability. As mentioned, counter 403 counts up or down depending on the logical state of received output signal 407. The count of counter 403 is presented to DCO 405 as a control signal DCOIn 416. In one embodiment, DCOIn 416 is a multi-bit digital signal for adjusting the output signal frequency of DCO 405.

DCO 405 adjusts its output signal frequency based on the value of received DCOIn 416. Specifically, DCO 405 adjusts the frequency of FBIn 412 and other output signals of DCO 405 based on DCOIn 416. FBIn 412 and other output signals of DCO 405 may be used to provide timing information to other circuits not shown.

For clarity of illustration, FBIn 412 is depicted in the following figures as being directly presented by DCO 405 to phase detector 401. As can be appreciated, however, additional components may be placed in the path of FBIn 412 and other signals disclosed in the present disclosure. For example, depending on the application and overall circuit structure, delay elements, counters, and other components may be placed in the path of FBIn 412 between DCO 405 and phase detector 401.

Figure 8:
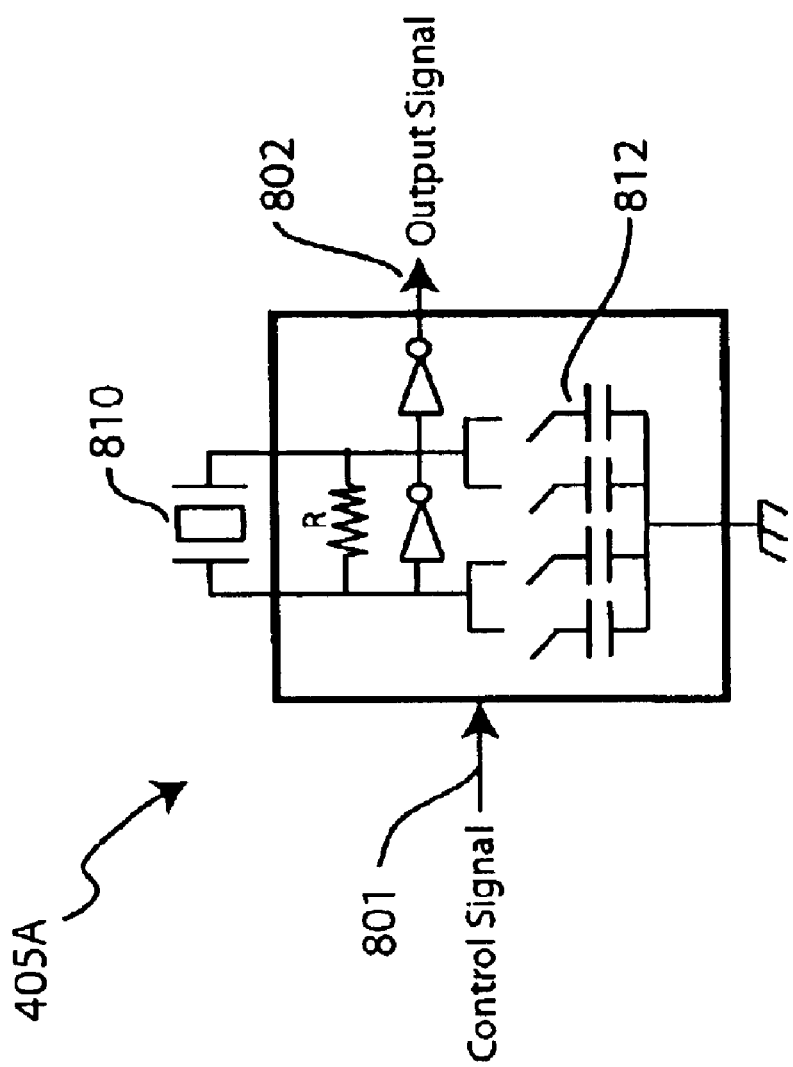
FIG. 8 shows a digitally controlled oscillator that may be used in embodiments of the present invention.

In one embodiment, DCO 405 is a digitally controlled crystal oscillator. For example, DCO 405 may be a conventional Pierce oscillator with a pullable crystal, such as DCO 405A schematically shown in FIG. 8. DCO 405A is a specific embodiment of DCO 405. Referring to FIG. 8, DCO 405A receives a control signal 801 and presents an output signal 802. Control signal 801 may be a count signal, such as DCOIn 416 (see FIG. 4), while output signal 802 may be a feedback signal, such as FBIn 412. Output signal 802 may also be used to provide timing information to other circuits not shown.

Still referring to FIG. 8, DCO 405A includes a pullable crystal 810 and a capacitor array 812. Capacitor array 812 may be configured to set the frequency of output signal 802.

Control signal 801 may be used to tune crystal 810 by selectively coupling one or more capacitors in capacitor array 812 to crystal 810. Generally speaking, coupling-in a capacitor decreases the frequency of output signal 802, thus retarding its phase; coupling-out a capacitor increases the frequency of output signal 802, thus advancing its phase. Capacitor array 812 may be binary weighted to correspond to bits of control signal 801, for example.

Referring back to FIG. 4, control loop 400 further includes a feed-forward circuit 460. Feed-forward circuit 460 is a digital variable-value feed-forward mechanism for improving the convergence time of control loop 400. In one embodiment, feed-forward circuit 460 is configured to determine a setting of DCO 405 that would result in the frequency of FBIn 412 approximating (i.e., becoming the same or close to) that of RefIn 410. As will be further explained below, DCO 405 may be provided that setting at a time when the phase error between RefIn 410 and FBIn 412 is negligibly small, thereby substantially converging the loop. As used in the present disclosure, the phrase "negligibly" small includes zero or a phase error so small that RefIn 410 and FBIn 412 are, for practical purposes, in-phase.

As shown in FIG. 4, feed-forward circuit 460 includes an inflection detector 461, averaging circuit 462, and memory elements denoted as registers 463 and 464. Inflection detector 461 may be a digital circuit configured to detect when RefLead 414 changes logical state. As will be further explained in connection with FIG. 6, that is a point in time when the phase error between RefIn 410 and FBIn 412 is substantially zero. By reading and processing the value of DCOIn 416 at several points in time when the phase error is substantially zero, a value of DCOIn 416 that would result in the frequency of FBIn 412 approximating that of RefIn 410 may be determined.

Inflection detector 461 may be implemented a variety of ways without detracting from the merits of the present invention. For example, inflection detector 461 may be implemented as an XNOR (exclusive NOR) operation of a present state and a previous state of RefLead 414. In one embodiment, inflection detector 461 asserts an output signal 408 commanding register 463 to store the value of DCOIn 416 when RefLead 414 transitions from a logical LOW state to a logical HIGH state. Inflection detector 461 asserts an output signal 409 commanding register 464 to store the value of DCOIn 416 when RefLead 414 transitions from a logical HIGH state to a logical LOW state.

Averaging circuit 462 receives the values stored in registers 463 and 464, and loads the resulting average value into counter 403 when the phase error between RefIn 410 and FBIn 412 is negligibly small. In one embodiment, averaging circuit 462 loads the average value into counter 403 when RefLead 414 transitions from one logical state to another, which is a point in time when the phase error between RefIn 410 and FBIn 412 is substantially zero. Loading the average value in counter 403 results in the average value being presented as DCOIn 416, thereby adjusting the frequency of FBIn 412 Feed-forward circuit 460 is referred to as a "variable-value" feed-forward mechanism because the average value being fed forward to the loop will change depending on the value of DCOIn 416 during state transitions of RefLead 414. Specifically, the average value is proportional to the amount of phase error and recalculated in each correction cycle rather than being fixed.

Figure 5:
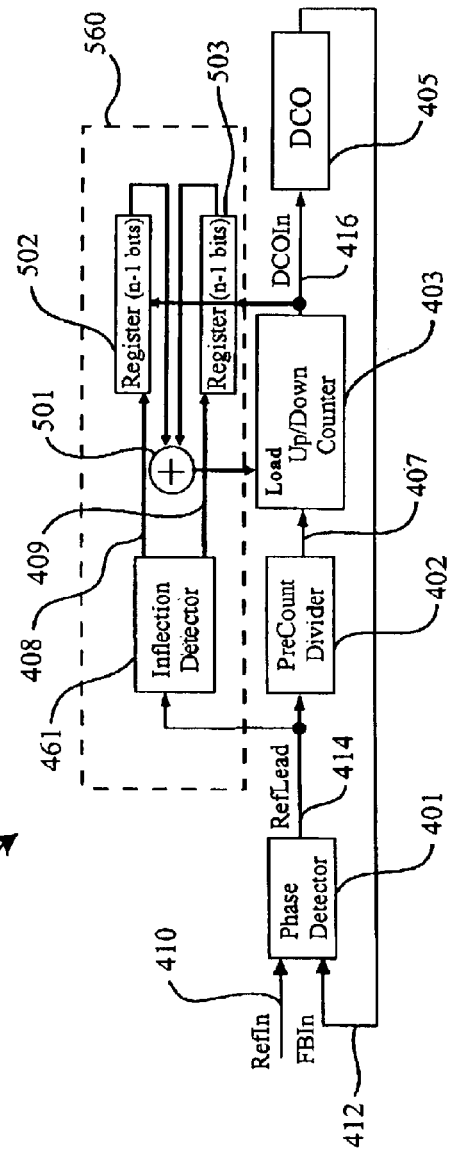
FIG. 5 shows a digital control loop in accordance with another embodiment of the present invention.

FIG. 5 shows a digital control loop 500 in accordance with an embodiment of the present invention. Control loop 500 has the same components as control loop 400 except that control loop 500 employs a digital variable-value feed forward circuit 560 (instead of 460). Feed-forward circuit 560, like feed-forward 460, feeds forward to the loop a variable value (e.g., the value loaded to counter 403) that is proportional to the amount of phase error.

Feed-forward circuit 560 includes inflection detector 461, adder 501, and memory elements denoted as registers 502 and 503. Registers 502 and 503 store the upper n−1 bits of DCOIn 416, which is essentially a divide by 2 operation on DCOIn 416. In an embodiment where DCOIn 416 is a 10-bit digital signal, registers 502 and 503 store the upper 9 bits of DCOIn 416 in response to a command from inflection detector 461. Adder 501 adds the values of registers 502 and 503, and loads the resulting sum into counter 403 when RefLead 414 transitions from one logical state to another, which is a point in time when the phase error between RefIn 410 and FBIn 412 is substantially zero. Loading the sum into counter 403 results in the sum being presented as DCOIn 416, thereby adjusting the frequency of FBIn 412.

Note that the sum presented by adder 501 is essentially an averaged value. This can be mathematically demonstrated for a 10-bit control signal (e.g., a 10-bit DCOIn 116) as follows:

$$Avg[9:0] = \frac{(Max[9:0] + Min[9:0])}{2}$$
$$= \frac{Max[9:0]}{2} + \frac{Min[9:0]}{2}$$
$$\cong Max[9:1] + Min[9:1]$$

Figure 6:
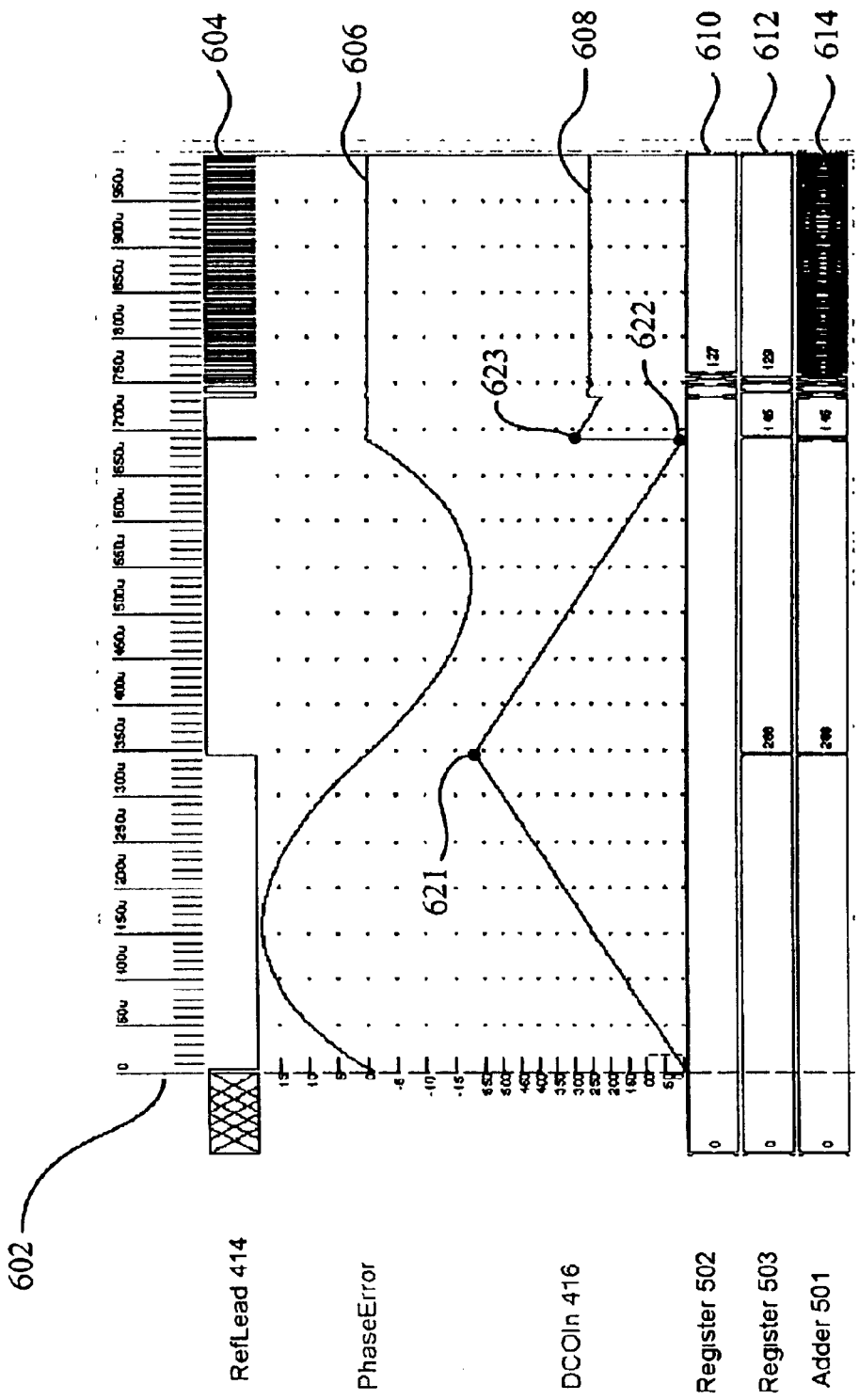
FIG. 6 shows a behavioral simulation of the control loop of FIG. 5.

FIG. 6 shows a behavioral simulation performed by the inventors on control loop 500. For the simulation of FIG. 6, DCO 405 is set to be a digitally controlled crystal oscillator comprising a conventional Pierce oscillator with a 13.5 MHz pullable crystal. DCOIn 416 is set to be a 10-bit digital signal adjusting the input capacitance of the Pierce oscillator, which in turn adjusts the frequency of FBIn 412. Pre-count divider 402 is set to a value of seven to adjust the loop update rate. The simulation was performed using the VERILOG-XL simulation software available from Cadence Design Systems.

In FIG. 6:

a) horizontal axis 602 represents time in microseconds;
b) plot 604 corresponds to the output of phase detector 401, which is RefLead 414;
c) plot 606 is the phase error between RefIn 410 and FBIn 412;
d) plot 608 corresponds to the value of the 10-bit digital control signal to DCO 405, which is DCOIn 416;
e) plot 610 corresponds to the upper 9-bits of DCOIn 416 captured into register 502;
f) plot 612 corresponds to the upper 9-bits of DCOIn 416 captured into register 503; and
g) plot 614 is the sum of the values stored in registers 502 and 503 that is loaded by adder 501 to counter 403.

FIG. 6 is now discussed with reference to components shown in FIG. 5. At time t=0, the phase error between RefIn 410 and FBIn 412 is zero but their frequencies are off. As the loop tries to correct the frequency error, RefLead 414 will eventually transition from a logical LOW state to a logical HIGH state. Inflection detector 461 detects this transition, and accordingly asserts output signal 408 to cause register 502 to capture the value of DCOIn 416 at point 621. At the next state transition of RefLead 414 at point 622, inflection detector 461 asserts output signal 409 to cause register 503 to capture the value of DCOIn 416 at point 622. Immediately thereafter, adder 501 adds the values stored in registers 502 and 503, and loads the resulting sum into counter 403. This changes the value of DCOIn 416 being presented to DCO 405 at point 623, thereby changing the frequency of FBIn 412 to approximate that of RefIn 410 at a time when the phase error between them is negligibly small. The next correction cycle begins with a much smaller phase and frequency error (compared to FIG. 2, for example). The loop continues toward convergence in this manner indefinitely, with substantially diminishing phase and frequency error with each correction. The loop converges in about 0.8 ms in FIG. 6, which is much faster compared to the 85 ms convergence time in FIG. 2.

Generally speaking, feed-forward circuit 560 (and 460) operates by determining a setting of DCO 405 that would result in the frequency of FBIn 412 approximating that of RefIn 410, and then controlling DCO 405 according to that setting at a time when the phase error between RefIn 410 and FBIn 412 is substantially zero. To determine that setting, realize that RefIn 410 and FBIn 412 have substantially the same frequency at points in time where the phase error is at its peak $$\left(\text{i.e., where } \frac{d\Phi}{dt} = 0\right).$$

Examination of FIG. 6 reveals that the phase error peaks between state transitions of RefLead 414. Thus, the setting may be determined by averaging the values of DCOIn 416 captured during state transitions of RefLead 414. The setting may then be presented to DCO 405 during a state transition of RefLead 414, which is a point in time when the phase error is substantially zero.

Another way of looking at control loop 500 is that the path comprising phase detector 401, pre-count divider 402, counter 403, and DCO 405 finds the right phase while feed-forward circuit 560 finds the right frequency. As demonstrated above, using a feed-forward circuit to find the right frequency allows the control loop to have a relatively short convergence time.

As can be appreciated by those of ordinary skill in the art reading the present disclosure, embodiments of the present invention may be implemented a variety of ways. For example, the components disclosed in the present disclosure may be implemented separately or together. As a specific example, counter 403 (or similar oscillator control circuits) may be separately implemented as shown in the figures, or integrated with DCO 405. Additionally, processing methods other than averaging or summing may also be performed depending on the application. For example, serial adders may be employed instead of parallel adders.

Figure 7:
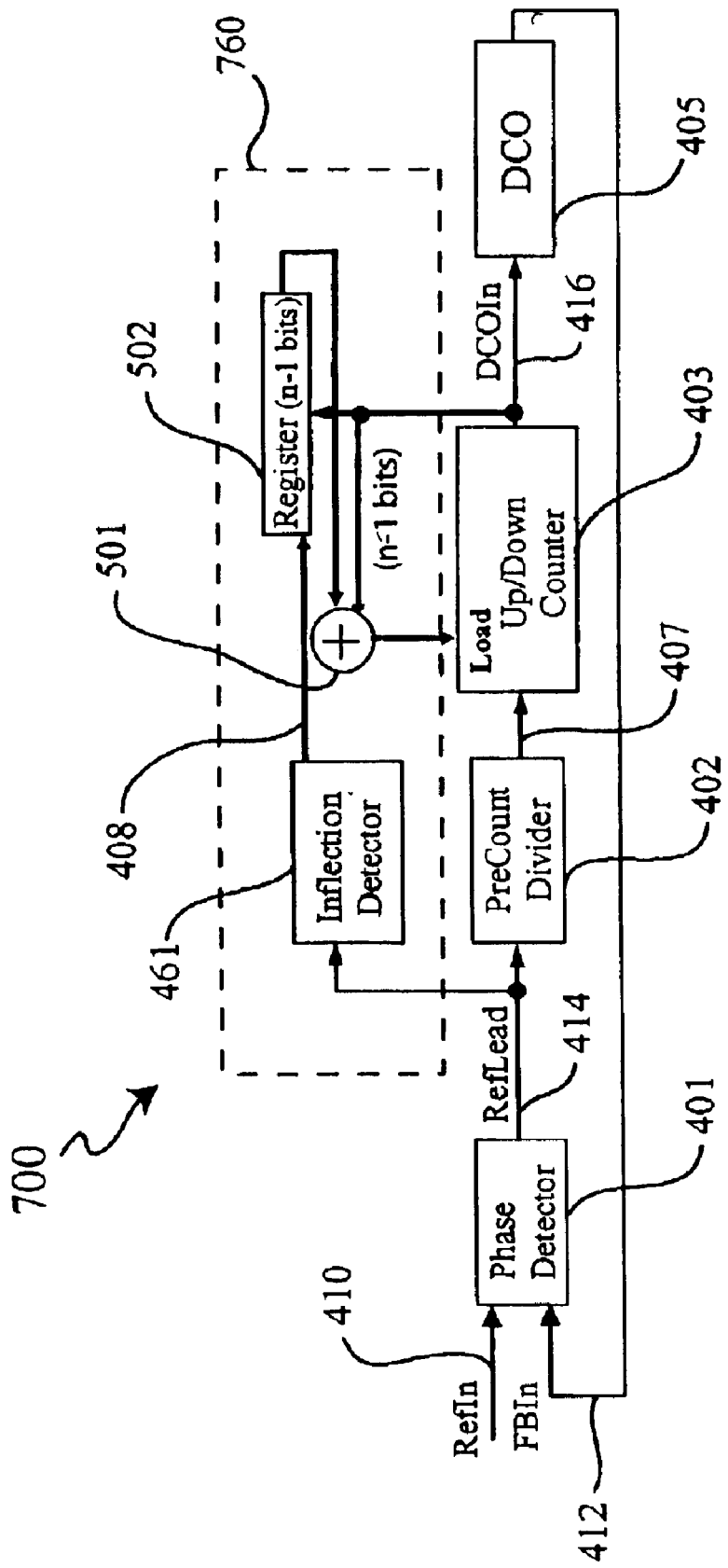
FIG. 7 shows a digital control loop in accordance with yet another embodiment of the present invention.

FIG. 7 shows a digital control loop 700 in accordance with an embodiment of the present invention. Control loop 700 has the same components as control loop 500 except that control loop 700 employs a digital variable-value feed forward circuit 760 (instead of 560). Feed-forward circuit 760, like feed-forward circuits 460 and 560, feeds forward to the loop a variable value (e.g., the value loaded to counter 403) that is proportional to the amount of phase error.

Feed-forward circuit 760 is essentially a feed-forward circuit 560 without register 503 and output signal 409. Feed-forward circuit 760 takes advantage of the fact that counter 403 is already holding the value to be captured into register 503. Adder 501 may thus simply load the upper n−1 bits of this value, and then add it to a value captured by register 502 at the next state transition of RefLead 414, thereby eliminating the need for register 503.

While specific embodiments of the present invention have been provided, it is to be understood that these embodiments are for illustration purposes and not limiting. Many additional embodiments will be apparent to persons of ordinary skill in the art reading this disclosure. Thus, the present invention is only limited by the following claims.

What is claimed is:

1. An electrical circuit comprising:
   a digital phase detector presenting a phase error signal indicative of a phase error between a first signal and a second-signal;
   a digital variable feed-forward circuit configured to determine a setting of a variable oscillator that would result in a frequency of the second signal approximating a frequency of the first signal; and
   an oscillator control circuit configured to control the variable oscillator according to the setting.

2. The circuit of claim 1 wherein the oscillator control circuit comprises a counter loadable with a value according to the setting.

3. The circuit of claim 1 wherein the oscillator control circuit is incorporated in the variable oscillator.

4. The circuit of claim 1 wherein the oscillator control circuit is configured to control the variable oscillator according to the setting when the phase error signal changes logical state.

5. The circuit of claim 1 wherein the oscillator control circuit is configured to control the variable oscillator according to the setting when the phase error between the first signal and the second signal is negligibly small.

6. The circuit of claim 1 wherein the variable oscillator comprises a digitally controlled Pierce oscillator.

7. The circuit of claim 1 wherein the feed-forward circuit comprises:
   an inflection detector configured to detect a logical state change of the phase error signal;
   a first memory element responsive to a first output presented by the inflection detector; and
   a processing circuit configured to accept a first value of the first memory element.

8. The circuit of claim 7 wherein the processing circuit is configured to average the first value of the first memory element with another value from another memory element.

9. The circuit of claim 7 wherein the processing circuit is configured to sum the first value of the first memory element and another value from another memory element.

10. The circuit of claim 7 wherein the processing circuit is configured to sum the first value of the first memory element and a second value of the first memory element, the second value being stored in the first memory element after the first value is provided to the processing circuit.

11. A method of converging a control loop of an electrical circuit, the method comprising:
determining a frequency of a first signal;
changing a frequency of a second signal to approximate the frequency of the first signal when a phase error between the first signal and the second signal is negligibly small; and
wherein determining the frequency of the first signal comprises:
obtaining a first setting of a variable oscillator when the phase error between the first signal and the second signal is approaching zero from a positive value;
obtaining a second setting of the variable oscillator when the phase error between the first signal and the second signal is approaching zero from a negative value; and
determining a third setting of the variable oscillator based on the first and second settings.

12. The method of claim 11 wherein determining the third setting comprises averaging the first and second settings.

13. The method of claim 11 wherein determining the third setting comprises summing the first and second settings.

14. The method of claim 11 wherein the third setting is loaded to a counter coupled to the variable oscillator.

15. The method of claim 11 wherein the variable oscillator comprises a digitally controlled oscillator.

16. An electrical circuit comprising:
digital phase detection means for detecting a phase difference between a feedback signal and a reference signal;
digital variable-value feed-forward means for determining a setting of a digitally controlled oscillator (DCO) that would result in a frequency of the feedback signal approximating a frequency of the reference signal; and
control means for adjusting the DCO according to the setting.

17. The electrical circuit of claim 16 wherein the control means comprises an up/down counter.

18. The electrical circuit of claim 16 wherein the digital variable-value feed-forward means comprises:
inflection detection means for detecting when a signal of the phase detection means changes logical state; and
memory means for storing a value presented to the DCO upon receipt of a control signal from the inflection detection means.

19. A method of converging a control loop of an electrical circuit, the method comprising:
determining a frequency of a first signal;
changing a frequency of a second signal to approximate the frequency of the first signal when a phase error between the first signal and the second signal is negligibly small; and
wherein the first signal and the second signal are received by a digital phase detector that is coupled to a digitally controlled oscillator presenting the second signal.

* * * * *